(12) United States Patent
Chen et al.

(10) Patent No.: US 11,983,480 B2
(45) Date of Patent: May 14, 2024

(54) CHECK TOOL AND CHECK METHOD FOR DESIGN RULE CHECK RULE DECK OF INTEGRATED CIRCUIT LAYOUT

(71) Applicant: CHANGXIN MEMORY TECHNOLOGIES, INC., Anhui (CN)

(72) Inventors: Chuanjiang Chen, Shanghai (CN); Li Bai, Shanghai (CN); Kang Zhao, Shanghai (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 407 days.

(21) Appl. No.: 17/399,107

(22) Filed: Aug. 11, 2021

(65) Prior Publication Data

US 2021/0383053 A1  Dec. 9, 2021

Related U.S. Application Data

(63) Continuation of application No. PCT/CN2021/094219, filed on May 17, 2021.

(30) Foreign Application Priority Data

Jun. 9, 2020 (CN) .......................... 202010517448.6

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
USPC .......................... 716/110, 111, 112, 118, 119
See application file for complete search history.

(56) References Cited

U.S. PATENT DOCUMENTS

| 6,063,132 A | 5/2000 | DeCamp |
| 7,757,190 B2 | 7/2010 | Dai |
| 9,934,349 B2 | 4/2018 | Bhawnani et al. |

(Continued)

FOREIGN PATENT DOCUMENTS

| CN | 101162477 A | 4/2008 |
| CN | 102368275 A | 3/2012 |

(Continued)

OTHER PUBLICATIONS

International Search Report in the international application No. PCT/CN2021/094219, dated Aug. 5, 2021, 5 pgs.

(Continued)

*Primary Examiner* — Brian Ngo
(74) *Attorney, Agent, or Firm* — Cooper Legal Group, LLC

(57) ABSTRACT

Embodiments of the application disclose a check tool and a check method for a Design Rule Check (DRC) rule deck of an integrated circuit layout. The check tool (100) for the DRC rule deck of the integrated circuit layout includes: an intelligent database creation engine (110), configured to generate a test case database; an intelligent arrangement engine (120), configured to generate a standard integrated circuit layout (150) according to the test case database; and an intelligent detection and analysis engine (130), configured to detect and analyze a target DRC rule deck (140) of the integrated circuit layout according to the standard integrated circuit layout (150).

14 Claims, 8 Drawing Sheets

(56) References Cited

U.S. PATENT DOCUMENTS

2005/0268259 A1* 12/2005 Du .................... G01R 31/2813
                                                          716/112
2016/0283642 A1   9/2016 Bhawnani et al.
2018/0121594 A1   5/2018 Studders
2020/0134131 A1*  4/2020 Tien .................... G06F 30/398

FOREIGN PATENT DOCUMENTS

CN      105653745 A        6/2016
CN      111125995 A    *   5/2020   ..... G01R 31/318364

OTHER PUBLICATIONS

Supplementary European Search Report in the European application No. 21766371.5, dated Jun. 7, 2022, 10 pgs.

* cited by examiner

CHECK TOOL AND CHECK METHOD FOR DESIGN RULE CHECK RULE DECK OF INTEGRATED CIRCUIT LAYOUT

CROSS-REFERENCE TO RELATED APPLICATIONS

This is a continuation of International Application No. PCT/CN2021/094219, filed on May 17, 2021, which claims priority to Chinese patent application No. 202010517448.6, filed on Jun. 9, 2020, and entitled "Check Tool and Check Method for Design Rule Check (DRC) Rule Deck of Integrated Circuit Layout". The disclosures of International Application No. PCT/CN2021/094219 and Chinese patent application No. 202010517448.6 are hereby incorporated by reference in their entireties.

TECHNICAL FIELD

Embodiments of the disclosure relate to the technical field of semiconductor integrated circuits, and particularly to a check tool and a check method for a Design Rule Check (DRC) rule deck of an integrated circuit layout.

BACKGROUND

In integrated circuit manufacturing, wafer factories need to formulate geometric dimension constraints at a same process layer and between different process layers that satisfy a chip manufacturing yield, according to different process parameters. A set of the geometric dimension constraints refer to a Design Rule Manual (DRM) of a layout. A development engineer is responsible for implementing each constraint of the DRM in a Design Rule Check (DRC) rule deck of a layout. After getting the DRC rule deck, a layout engineer needs to perform a DRC of the layout on the designed layout by using the DRC rule deck.

The DRC of the layout emerges with a design of a semiconductor transistor circuit. Whether a single transistor is designed or a complicated System on Chip (SOC) is designed, a DRC should be performed to ensure that the layout design is technologically reliable and can be produced smoothly. FIG. 1 is a schematic flowchart of a DRC of an integrated circuit layout in the art. Referring to FIG. 1, at present, the DRC of the layout is performed manually by a layout engineer to find out all potential short circuits, open circuits, or other adverse errors caused by violations to design rules in the layout. If the layout engineer does not find the physical verification errors, and it will be found that the layout does not meet requirements of process manufacturing only in a late stage of chip production, so that subsequent production and manufacturing of the chip may be affected greatly. Thus, the chips produced by the factory even cannot be used, and a huge economic loss will be caused eventually.

SUMMARY

Embodiments of the disclosure provide a check tool and a check method for a Design Rule Check (DRC) rule deck of an integrated circuit layout, to ensure that the DRC rule deck is consistent with design rules defined in a Design Rule Manual (DRM), and further to improve a chip manufacturing yield.

According to a first aspect, an embodiment of the disclosure provides a check tool for a DRC rule deck of an integrated circuit layout, and the check tool includes an intelligent database creation engine, an arrangement placement engine, and an intelligent detection and analysis engine.

The intelligent database creation engine is configured to generate a test case database.

The intelligent arrangement engine is configured to generate a standard integrated circuit layout according to the test case database.

The intelligent detection and analysis engine is configured to detect and analyze a target DRC rule deck of the integrated circuit layout according to the standard integrated circuit layout.

According to a second aspect, an embodiment of the disclosure also provides a check method for a Design Rule Check (DRC) rule deck of an integrated circuit layout, which may be applied to the check tool for the DRC rule deck of the integrated circuit layout from the embodiment of the first aspect of the disclosure, the check method including the following operations.

A test case database is generated according to an intelligent database creation engine.

An intelligent arrangement engine is controlled to generate a standard integrated circuit layout according to the test case database.

A target DRC rule deck of the integrated circuit layout is provided for an intelligent detection and analysis engine, and the intelligent detection and analysis engine is controlled to detect and analyze the target DRC rule deck of the integrated circuit layout according to the standard integrated circuit layout.

DETAILED DESCRIPTION

Figure 1:
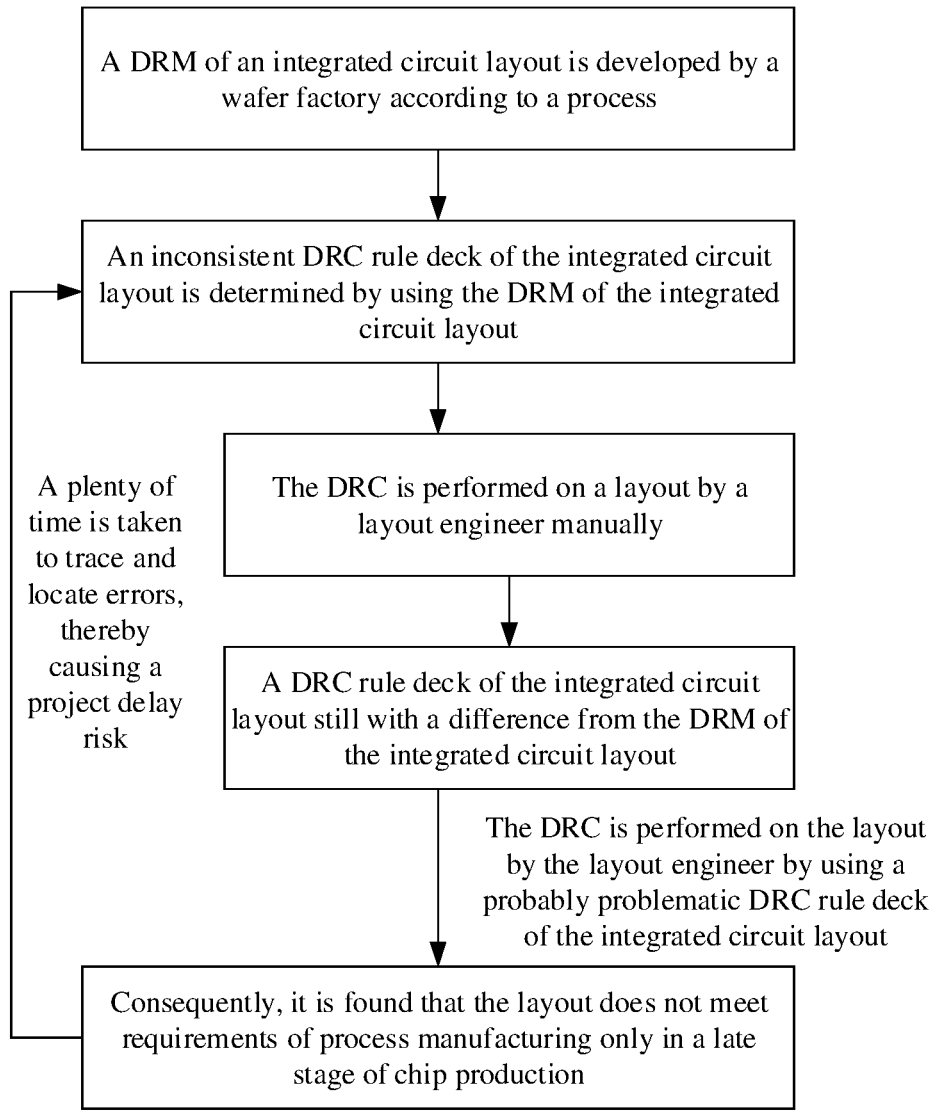
FIG. 1 is a schematic flowchart of a DRC of an integrated circuit layout according to the art.

In order to make the objectives, technical solutions, and advantages of the disclosure clearer, specific embodiments of the disclosure will further be described below in combination with the drawings in detail. It should be understood that the specific embodiments described here are only used to explain the disclosure, but not to limit the disclosure.

In addition, it also should be noted that, for convenient description, not all but only part of contents of the disclosure are illustrated in the drawings. Before exemplary embodiments are discussed in more detail, it is to be mentioned that some exemplary embodiments are described as processing or methods described as flowcharts. Although each operation (or step) in the flowcharts is described into sequential processing, many operations therein may be implemented in parallel, concurrently, or simultaneously. In addition, each operation may be rearranged in another sequence. The processing may be terminated when operations thereof are completed, but there may also be additional steps not included in the drawings. The processing may correspond to a method, a function, a procedure, a subroutine, a subprogram, etc.

According to a first aspect, an embodiment of the disclosure provides a check tool for a DRC rule deck of an integrated circuit layout, and the check tool includes an intelligent database creation engine, an arrangement placement engine, and an intelligent detection and analysis engine.

The intelligent database creation engine is configured to generate a test case database.

The intelligent arrangement engine is configured to generate a standard integrated circuit layout according to the test case database.

The intelligent detection and analysis engine is configured to detect and analyze a target DRC rule deck of the integrated circuit layout according to the standard integrated circuit layout.

Further, the target DRC rule deck of the integrated circuit layout may include a plurality of standard specifications of design rules for the integrated circuit layout, and a standard-specification test case database may be respectively established for each of the plurality of standard specifications.

Further, the plurality of standard specifications may include a positive specification and a negative specification.

Further, the standard-specification test case database may be configured to generate a plurality of standard integrated circuit layouts, and the standard-specification test case database may be set in the intelligent database creation engine.

Further, each of the plurality of the standard integrated circuit layouts may correspond to a different golden result.

Further, the intelligent detection and analysis engine may further be configured to generate a detection report, the detection report including information for determining whether the target DRC rule deck of the integrated circuit layout is correct.

Further, in response to the detection report including first-type error information of the plurality of the standard specifications, the intelligent database creation engine may not be updated.

In response to that the detection report includes second-type error information of the plurality of the standard specifications, the intelligent database creation engine may be updated.

Further, the updated intelligent database creation engine may be configured to check the target DRC rule deck of the integrated circuit layout to generate a target detection report, and the target detection report does not include the second-type error information.

According to a second aspect, an embodiment of the disclosure also provides a check method for a Design Rule Check (DRC) rule deck of an integrated circuit layout, which may be applied to the check tool for the DRC rule deck of the integrated circuit layout from the embodiment of the first aspect of the disclosure, the check method including the following operations.

A test case database is generated according to an intelligent database creation engine.

An intelligent arrangement engine is controlled to generate a standard integrated circuit layout according to the test case database.

A target DRC rule deck of the integrated circuit layout is provided for an intelligent detection and analysis engine, and the intelligent detection and analysis engine is controlled to detect and analyze the target DRC rule deck of the integrated circuit layout according to the standard integrated circuit layout.

Further, the check method may further include the following operation.

The target DRC rule deck of the integrated circuit layout is generated according to a Design Rule Manual (DRM) of the integrated circuit layout developed by a semiconductor manufacturing factory.

According to the technical solutions of the embodiments of the disclosure, the check tool for a DRC rule deck of an integrated circuit layout includes: the intelligent database creation engine, which is configured to generate the test case database, the intelligent arrangement engine, which is configured to generate the standard integrated circuit layout according to the test case database, and the intelligent detection and analysis engine, which is configured to detect and analyze the target DRC rule deck of the integrated circuit layout according to the standard integrated circuit layout. The problem in the art that subsequent production and manufacturing of a chip is affected, the chip even cannot be used and a huge economic loss may eventually be brought, because DRC is only performed on a layout manually by a layout engineer and a physical verification error may not be found is solved. Thus, it is ensured that design rules defined in a DRC rule deck and the DRM can be consistent, and a manufacturing yield of the chip can be improved.

Figure 2:
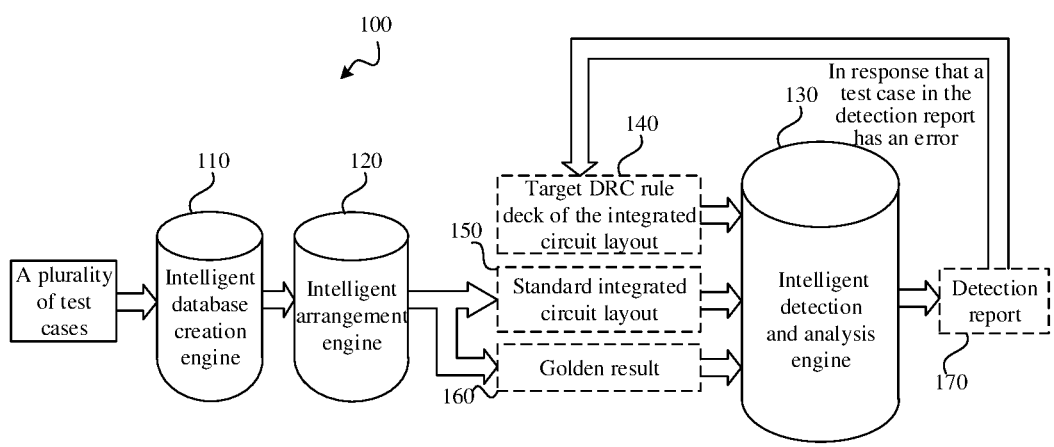
FIG. 2 is a schematic structural diagram of a check tool for a DRC rule deck of an integrated circuit layout according to an embodiment of the disclosure.

FIG. 2 is a schematic structural diagram of a check tool for a DRC rule deck of an integrated circuit layout according to an embodiment of the disclosure. The embodiment may be applied to reliability analysis over a DRC rule deck of a layout. Specifically, the check tool 100 for the DRC rule deck of the integrated circuit layout structurally includes an intelligent database creation engine 110, an intelligent arrangement engine 120, and an intelligent detection and analysis engine 130.

The intelligent database creation engine 110 is configured to generate a test case database.

The intelligent arrangement engine 120 is configured to generate a standard integrated circuit layout 150 according to the test case database.

The intelligent detection and analysis engine 130 is configured to detect and analyze a target DRC rule deck 140 of the integrated circuit layout according to the standard integrated circuit layout 150.

The test case database may include a plurality of test cases, and each of the test cases may include, but not limited to, a plurality of design rules.

The intelligent database creation engine 110 may generate a plurality of test case databases through an intelligent test case database creation algorithm, each of the test case databases corresponding to a design rule.

Figure 3:
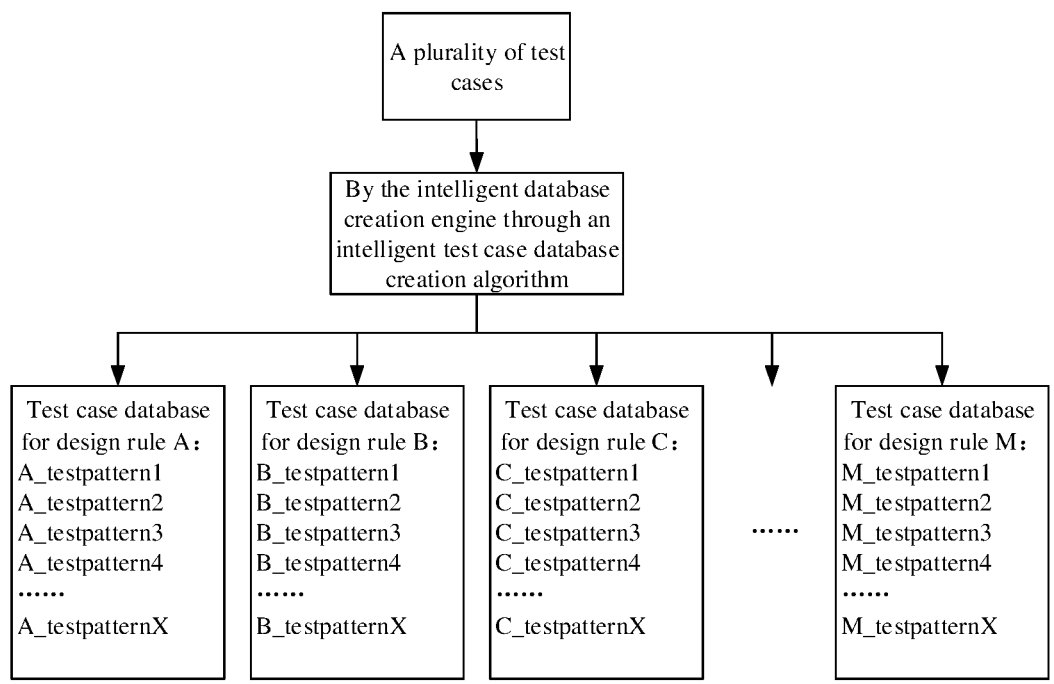
FIG. 3 is a schematic flowchart of a process of generating test case databases by an intelligent database creation engine according to an embodiment of the disclosure.

Exemplarily, FIG. 3 is a schematic flowchart of a process of generating test case databases by an intelligent database creation engine 110 according to an embodiment of the disclosure. Referring to FIG. 3, a design rule A, a design rule B, a design rule C, and a design rule M may be obtained according to different types of design rules. The intelligent database creation engine 110 may establish a test case database for each design rule through the intelligent test case database creation algorithm. Thus, there may be a test case database corresponding to the design rule A, a test case database corresponding to the rule B, a test case database corresponding to the design rule C, and a test case database corresponding to the design rule M.

The intelligent arrangement engine 120 may generate the standard integrated circuit layout 150 through an intelligent test case arrangement algorithm. It can be understood that a plurality of standard integrated circuit layouts 150 may be generated correspondingly for the plurality of test case databases, and each of the plurality of standard integrated circuit layouts 150 may respectively correspond to the design rule corresponding to each of the test case databases.

The intelligent detection and analysis engine 130 may detect and analyze the target DRC rule deck 140 of the integrated circuit layout according to the standard integrated circuit layout 150, to ensure that the implementation of the design rule in the target DRC rule deck 140 of the target integrated circuit layout can be completely consistent with a definition of a design rule in a DRM of the layout, thereby ensuring subsequent chip functions and a manufacturing yield.

Based on the aforementioned embodiments, the target DRC rule deck 140 of the integrated circuit layout may include a plurality of standard specifications of design rules of the integrated circuit layout, and a standard-specification test case database may be respectively established for each of the plurality of the standard specifications.

The standard specifications may include a design rule in layout design.

It can be understood that the target DRC rule deck 140 of the integrated circuit layout may include a plurality of design rules of the DRC of the integrated circuit layout. A standard specification test case database for each of the design rules may be correspondingly established for the respective design rule.

Based on the aforementioned embodiments, the standard specifications may include a positive specification and a negative specification.

The positive specification may be a design rule consistent with the DRC of the integrated circuit layout, and the negative specification may be a design rule inconsistent with the DRC of the integrated circuit layout.

It can be understood that the standard-specification test case database may be correspondingly established for each of the standard specifications, so that each standard-specification test case database may include test cases of the positive specification and test cases of the negative specification. The numbers of the test cases of the positive specification and the test cases of the negative specification may be the same, or may be different. The specific number of the test cases in the standard-specification test case database may be selected and set by those skilled in the art as practically required. No limits are made thereto in the embodiments.

Exemplarily, referring back to FIG. 3, the test case database established for each of the standard specifications may include a plurality of test cases. A test case database for the design rule A may be a test case database corresponding to a standard specification A. A plurality of test cases in the test case database corresponding to the standard specification A may include: A_testpattern1, A_testpattern2, A_testpattern3, . . . , and A_testpatternX respectively; and the A_testpattern1, the A_testpattern2, the A_testpattern3, . . . , and the A_testpatternX may respectively correspond to different test cases. It can be understood that the A_testpattern1 may be a test case of a positive specification, or a test case of a negative specification. Similarly, the A_testpatternX may be a test case of a positive specification, or a test case of a negative specification. A specification type corresponding to each test case is not limited in the embodiment.

Similarly, a test case database for the design rule B may be a test case database corresponding to a standard specification B. A plurality of test cases in the test case database corresponding to the standard specification B may include: B_testpattern1, B_testpattern2, B_testpattern3, . . . , and B_testpatternX respectively; and the B_testpattern1, the B_testpattern2, the B_testpattern3, . . . , and the B_testpatternX may respectively correspond to different test cases. It can be understood that the B_testpattern1 may be a test case of a positive specification, or a test case of a negative specification. Similarly, the B_testpatternX may be a test case of the positive specification, or a test case of the negative specification.

The test case database for the design rule M may be a test case database corresponding to a standard specification M. A plurality of test cases in the test case database corresponding to the standard specification M may include: M_testpattern1, M_testpattern2, M_testpattern3, . . . , and M_testpatternX respectively; and the M_testpattern1, the M_testpattern2, the M_testpattern3, . . . , and the M_testpatternX may respectively correspond to different test cases. It can be understood that M_testpattern1 may be a test case of the positive specification, or a test case of the negative specification. Similarly, the M_testpatternX may be a test case of the positive specification, or a test case of the negative specification.

It can be understood that the test case database corresponding to each of the standard specifications may include the same number of test cases, or may include different numbers of test cases. That is, a corresponding value of X in each of the test case databases may be the same value, or may be different values.

Based on the aforementioned embodiments, the standard-specification test case database may be configured to generate a plurality of standard integrated circuit layouts 150, and the standard specification test case database may be set in the intelligent database creation engine 110.

The plurality of standard integrated circuit layouts 150 may include a standard integrated circuit layout of the positive specification and a standard integrated circuit layout of the negative specification.

A standard-specification test case database for each of the design rules may be correspondingly established for the design rule, and the standard-specification test case database for the each of the design rules may include the standard integrated circuit layout of the positive specification and the standard integrated circuit layout of the negative specification.

Specifically, the intelligent arrangement engine 120 may intelligently arrange all of the test cases corresponding to the standard specifications through the intelligent test case arrangement algorithm, to generate the plurality of standard integrated circuit layouts 150. The plurality of standard integrated circuit layouts 150 may show the design rules among the included devices.

Figure 4:
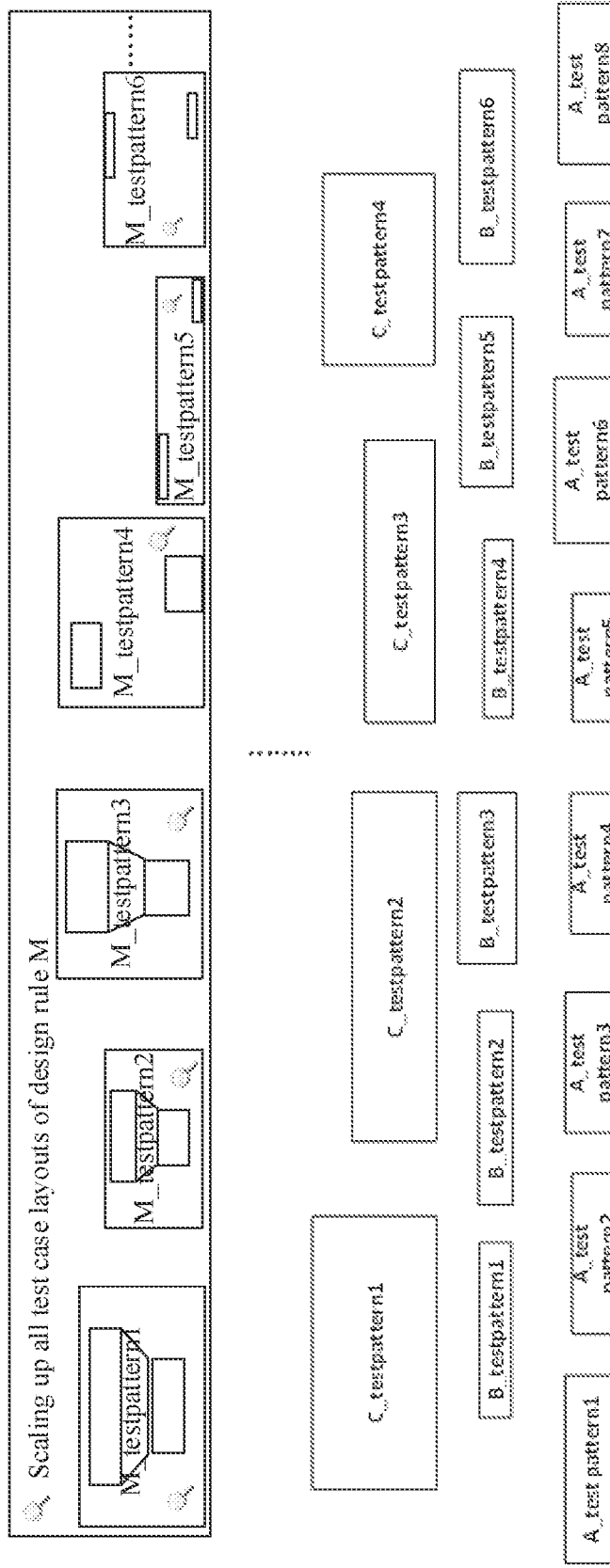
FIG. 4 is a schematic diagram of a process of generating standard integrated circuit layouts by an intelligent arrangement engine according to an embodiment of the disclosure.

Exemplarily, FIG. 4 is a schematic diagram of a process of generating standard integrated circuit layouts 150 by an intelligent arrangement engine 120 according to an embodiment of the disclosure. Referring to FIG. 4, the standard integrated circuit layouts 150 may be generated correspondingly for a plurality of test cases in each of test case databases corresponding to each of standard specifications. It can be understood that the standard integrated circuit layouts 150 corresponding to all of the test cases in the test case database corresponding to a standard specification, may include a standard integrated circuit layout corresponding to test cases of a positive specification and a standard integrated circuit layout corresponding to test cases of a negative specification.

Referring back to FIG. 3 and FIG. 4, in FIG. 3, the test case database for the design rule A may include a plurality of test cases of the A_testpattern1, the A_testpattern2, the A_testpattern3, the A_testpattern4, the A_testpattern5, ..., and the A_testpatternX, which are used to respectively generate standard integrated circuit layouts 150 in FIG. 4. And in FIG. 4, the standard integrated circuit layouts 150 corresponding to the test cases in the test case database for the design rule A may include the A_testpattern1, the A_testpattern2, the A_testpattern3, the A_testpattern4, the A_testpattern5, ..., and the A_testpatternX respectively, to represent the standard integrated circuit layouts 150 corresponding to the test cases.

Similarly, in FIG. 3, the test case database for the design rule B may include a plurality of test cases of the B_testpattern1, the B_testpattern2, the B_testpattern3, the B_testpattern4, the B_testpattern5, ..., and the B_testpatternX, which are used to respectively generate standard integrated circuit layouts 150 of the B_testpattern1, the B_testpattern2, the B_testpattern3, the B_testpattern4, the B_testpattern5, ..., and the B_testpatternX in FIG. 4, to represent the standard integrated circuit layouts 150 corresponding to the test cases.

In FIG. 3, the test case database for the design rule M may include a plurality of test cases of the M_testpattern1, the M_testpattern2, the M_testpattern3, the M_testpattern4, the M_testpattern5, ..., and the M_testpatternX which are used to respectively generate standard integrated circuit layouts 150 of the M_testpattern1, the M_testpattern2, the M_testpattern3, the M_testpattern4, the M_testpattern5, ..., and the M_testpatternX in FIG. 4, to represent the standard integrated circuit layouts 150 corresponding to the test cases.

It is to be noted that, after generating the standard integrated circuit layouts 150 in FIG. 4, an operation such as scaling up, scaling down, rotation, or mirroring may be performed on test case layouts of each of the standard specifications. Therefore, the operation such as scaling up, scaling down, rotation, or mirroring may be performed on each of the standard integrated circuit layouts 150 of the M_testpattern1, the M_testpattern2, the M_testpattern3, the M_testpattern4, the M_testpattern5, ..., and the M_testpatternX, to generate a new standard integrated circuit layout 150.

Alternatively, each of the standard integrated circuit layouts 150 may present a specific design rule of the corresponding standard specification according to a process setting, for example, a width rule or a spacing rule involved in the design rule.

It should be noted that, when there is a physical verification error of a corresponding design rule in a test case, corresponding results may be stored on a design rule layout of an integrated circuit corresponding to the present test case through the check tool of the DRC rule deck of the integrated circuit layout.

Based on the aforementioned embodiments, each of the standard integrated circuit layouts 150 may correspond to a different golden result 160.

The golden result 160 corresponding to the respective standard integrated circuit layout 150 may be a correct arrangement position of a corresponding device in the respective standard integrated circuit layout 150. The golden result 160 corresponding to the respective standard integrated circuit layout 150 may be generated at a same time when the standard integrated circuit layout 150 is generated.

The golden result 160 corresponding to the respective standard integrated circuit layout 150 may be different. Alternatively, a result in a specified error range may be determined as the golden result 160, and in such case, the golden result 160 corresponding to the respective standard integrated circuit layout 150 may be the same.

Referring back to FIG. 2, based on the aforementioned embodiments, the intelligent detection and analysis engine 130 may be further configured to generate a detection report 170, the detection report 170 including information for determining whether the target DRC rule deck 140 of the integrated circuit layout is correct.

The detection report 170 may be a result of detecting and analyzing the target DRC rule deck 140 of the integrated circuit layout according to the standard integrated circuit layout 150. The detection report 170 may reflect whether each of the design rules in the target DRC rule deck 140 of the integrated circuit layout is consistent with the design rule defined in the DRM of the layout.

The detection report 170 may include a detection result obtained based on the standard-specification test case database corresponding to each of the standard specifications. That is, the respective standard specification test case database may include the test cases of the positive specification and the test cases of the negative specification. And the detection report 170 may further include a detection result obtained based on the test cases of the positive specification and a detection result obtained based on the test cases of the negative specification.

It should be noted that, in the embodiment, a development engineer of the DRC rule deck of the layout needs to analyze the test cases reporting errors in the detection report 170 carefully. That is, it may be determined whether the test cases reporting the errors are of the positive specification or of the negative specification.

Based on the aforementioned embodiments, in response to the detection report 170 including first-type error information of the standard specifications, the intelligent database creation engine 110 may not be updated.

In response to that the detection report 170 includes second-type error information of the standard specifications, the intelligent database creation engine 110 may be updated.

The first-type error information of the standard specifications may indicate that the detection results obtained based on the test cases of the positive specification are correct, and the detection results obtained based on the test cases of the negative specification are incorrect. In such case, the design rule corresponding to the target DRC rule deck 140 of the integrated circuit layout can be directly modified, and the intelligent database creation engine 110 may not be required to be updated.

The second-type error information of the standard specifications may indicate that the detection results obtained based on the test cases of the positive specification are correct, and the detection results obtained based on the test cases of the negative specification are incorrect. In such case, the present test case database may not include the present test case layout, and the layout engineer is required to be notified to timely update the intelligent database creation engine 110 with the layout corresponding to the present target DRC rule deck 140 of the integrated circuit layout as a new test case to adapt to a DRC rule deck of a layout that does not appear.

It should be noted that, in response to the detection results obtained based on the test cases of the positive specification being correct and the detection results obtained based on the test cases of the negative specification also being correct, it may indicate that a present target DRC rule deck 140 of the integrated circuit layout is correct, and modification will not be required. In response to the detection results obtained based on the test cases of the positive specification being correct and the detection results obtained based on the test cases of the negative specification being incorrect, it may also indicate that the present target DRC rule deck 140 of the integrated circuit layout is correct, and modification will not be required.

Figure 5:
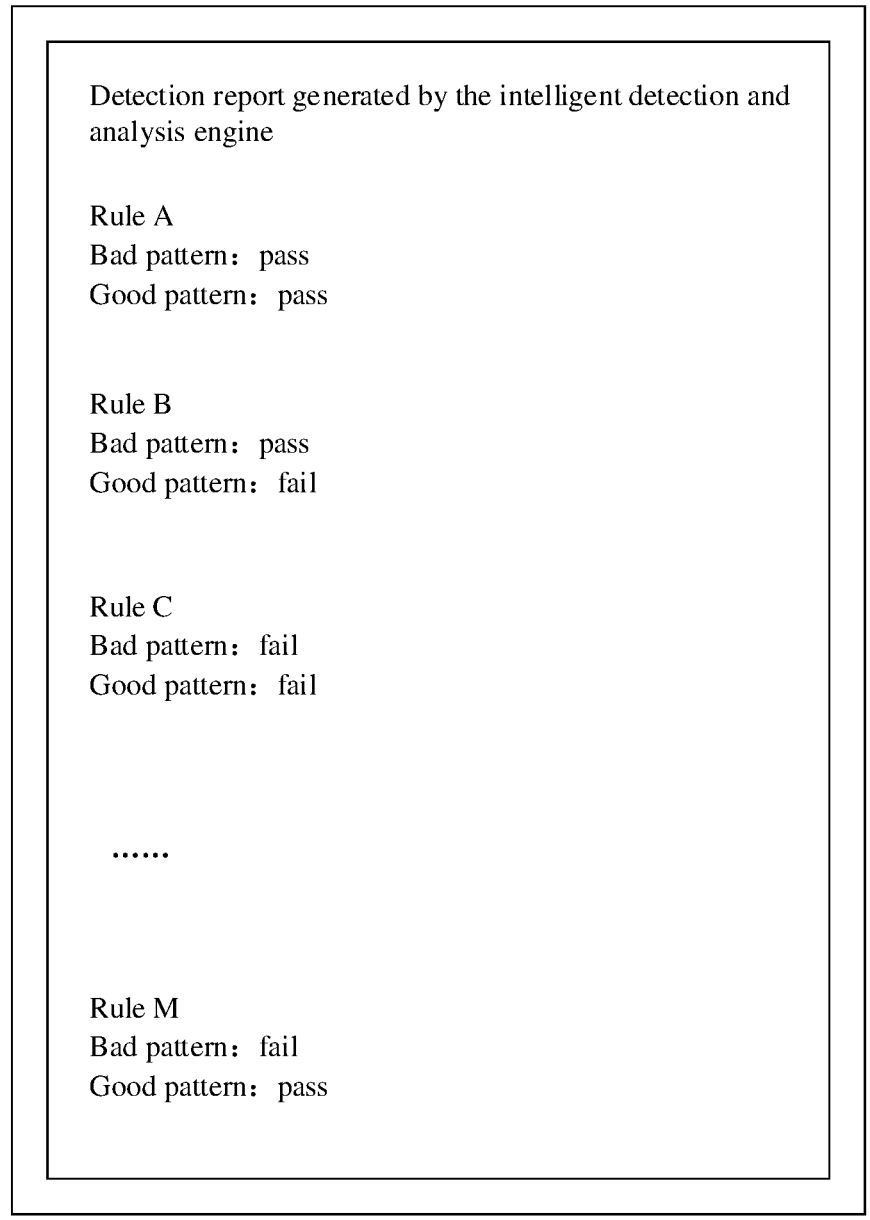
FIG. 5 is a schematic diagram of a detection report generated by an intelligent detection and analysis engine according to an embodiment of the disclosure.

Exemplarily, FIG. 5 is a schematic diagram of a detection report 170 generated by an intelligent detection and analysis engine 130 according to an embodiment of the disclosure. Referring to FIG. 5, "Rule" represents a design rule in the target DRC rule deck 140 of the integrated circuit layout. "Bad pattern" represents that the test cases of the negative specification are analyzed and detected and the detection results obtained correspondingly based on the test cases of the negative specification are displayed. And "Good pattern" represents that the test cases of the positive specification are analyzed and detected and the detection results obtained correspondingly based on the test cases of the positive specification are displayed.

For Rule A, detection results obtained based on test cases of the positive specification are displayed as being correct, and detection results obtained based on test cases of the negative specification are displayed as being correct. That is, when the results indicated by "Good pattern" correspond to "pass", and the results indicated by "Bad pattern" correspond to "pass", it may indicate that the present target DRC rule deck 140 of the integrated circuit layout is correct, and modification will not be required. For Rule B, detection results obtained based on test cases of the positive specification are displayed as being correct, and detection results obtained based on test cases of the negative specification are displayed as being incorrect. That is, when the results indicated by "Good pattern" correspond to "fail", and the results indicated by "Bad pattern" correspond to "pass", it may indicate that the design rule corresponding to the present target DRC rule deck 140 of the integrated circuit layout needs to be directly modified, and the intelligent database creation engine 110 will not be required to be updated. For Rule C, detection results obtained based on test cases of the positive specification are displayed as being incorrect, and detection results obtained based on test cases of the negative specification are displayed as being incorrect. That is, when the results indicated by "Good pattern" correspond to "fail", and the results indicated by "Bad pattern" correspond to "fail", it may indicate that the intelligent database creation engine 110 needs to be timely updated to adapt a DRC rule deck of a layout that does not appear. For Rule M, detection results obtained based on test cases of the positive specification are displayed as being correct, and detection results obtained based on test cases of the negative specification are displayed as being incorrect. That is, when the results indicated by "Good pattern" correspond to "pass", and the results indicated by "Bad pattern" correspond to "fail", it may also indicate that the present target DRC rule deck 140 of the integrated circuit layout is correct, and modification will not be required.

Based on the aforementioned embodiments, the updated intelligent database creation engine 110 may be configured to check the target DRC rule deck 140 of the integrated circuit layout to generate a target detection report 170, and the target detection report 170 does not include the second-type error information.

It should be understood that, after the intelligent database creation engine 110 being updated, the target DRC rule deck 140 of the integrated circuit layout may be detected and analyzed through the intelligent detection and analysis engine 130, to obtain the target detection report 170. In such case, the target detection report 170 may include no second-type error information.

Figure 6:
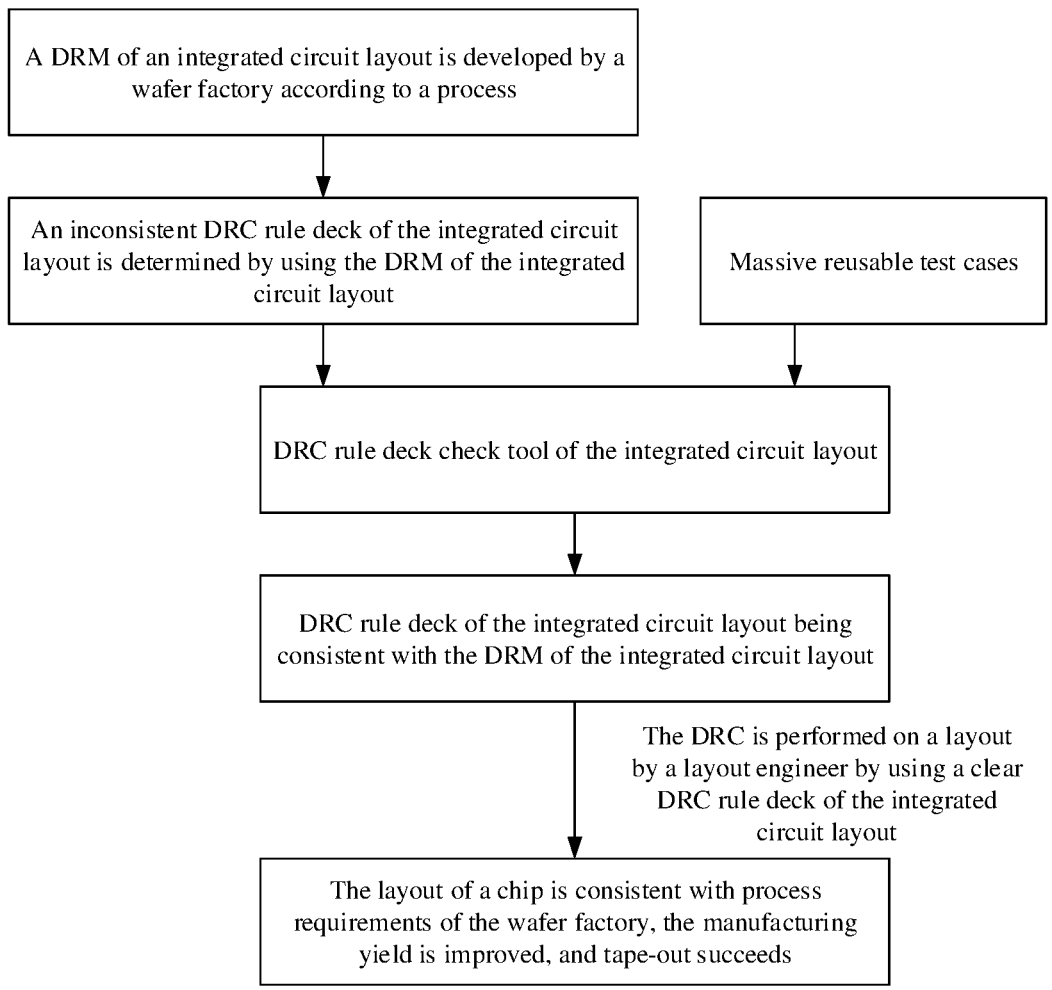
FIG. 6 is a schematic flowchart of a DRC of an integrated circuit layout according to an embodiment of the disclosure.

FIG. 6 is a schematic flowchart of a DRC of an integrated circuit layout according to an embodiment of the disclosure. Referring to FIG. 6, according to the technical solution of the embodiment of the disclosure, a test case database is generated through an intelligent database creation engine 110. An intelligent arrangement engine 120 generates a standard integrated circuit layout 150 according to the test case database. And the intelligent detection and analysis engine 130 detects and analyzes a target DRC rule deck 140 of the integrated circuit layout according to the standard integrated circuit layout 150. According to the check tool for the DRC rule deck of the integrated circuit layout provided in the embodiments of the disclosure, massive test cases can be used to automatically check the DRC rule deck of the integrated circuit layout in a rapid and accurate manner And all technological physical verification problems may be recorded and traced through the test case database, to determine that the DRC rule deck of the integrated circuit layout used by the layout engineer is correct. Therefore, accurate DRC results can be obtained, to eventually improve the manufacturing yield of the chip and reduce the cost.

Figure 7:
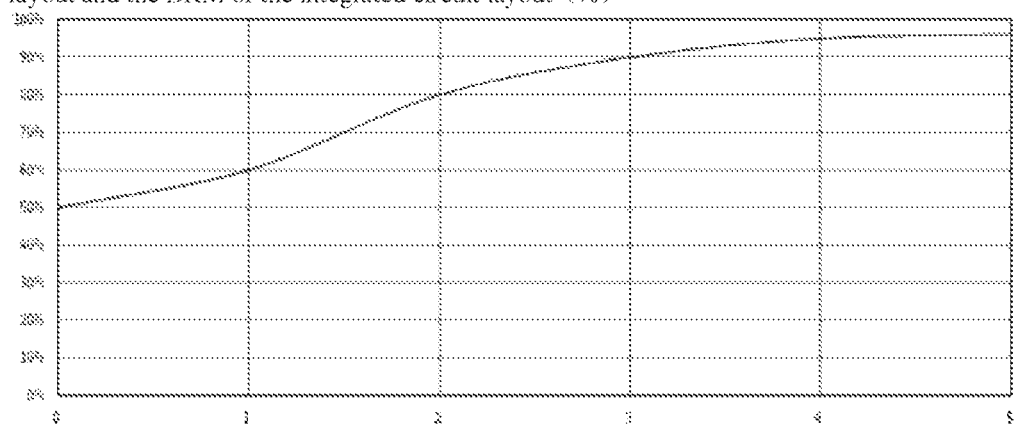
FIG. 7 is a schematic diagram of a consistency percentage between a DRC rule deck of an integrated circuit layout and a DRM of the integrated circuit layout according to an embodiment of the disclosure.

In addition, FIG. 7 is a schematic diagram of a consistency percentage between a DRC rule deck of an integrated circuit layout and a DRM of the integrated circuit layout according to an embodiment of the disclosure. Referring to FIG. 7, the abscissa represents the number of running times of the DRC rule deck of the integrated circuit layout through the check tool for the DRC rule deck of the integrated circuit layout. With the constant accumulation of the test case database, when the number of running times of the check tool for the design rule of the integrated circuit layout increases, the layout design rule in the DRC rule deck of the integrated circuit layout may tend to be consistent with the design rule defined in the DRM of the integrated circuit layout, and the manufacturing yield of the chip can be eventually improved.

Figure 8:
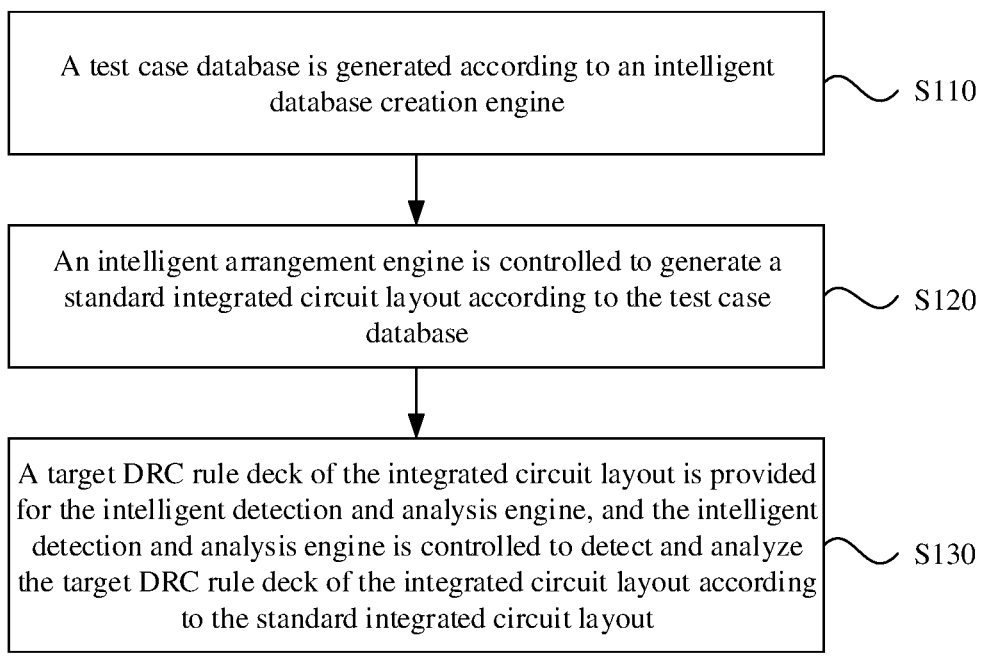
FIG. 8 is a schematic flowchart of a check method for a DRC rule deck of an integrated circuit layout according to an embodiment of the disclosure.

FIG. 8 is a schematic flowchart of a check method for a DRC rule deck of an integrated circuit layout according to an embodiment of the disclosure. The embodiment may be applied to reliability analysis over a DRC rule deck of a layout. The method of the embodiments may specifically include the following operations of S110 to S130.

In S110, a test case database is generated according to an intelligent database creation engine 110.

Specifically, the intelligent database creation engine 110 may generate a plurality of test case databases through an intelligent test case database creation algorithm, each of the test case databases may correspond to a design rule.

In S120, an intelligent arrangement engine 120 is controlled to generate a standard integrated circuit layout 150 according to the test case database.

The intelligent arrangement engine 120 may be controlled to generate the standard integrated circuit layout 150 through an intelligent test case arrangement algorithm. A plurality of standard integrated circuit layouts 150 may be correspondingly generated for the plurality of test case databases, and the plurality of standard integrated circuit layouts 150 may correspond to design rules corresponding to the respective test case database.

In S130, a target DRC rule deck 140 of the integrated circuit layout is provided for an intelligent detection and analysis engine 130, and the intelligent detection and analysis engine 130 is controlled to detect and analyze the target DRC rule deck 140 of the integrated circuit layout according to the standard integrated circuit layout 150.

Specifically, the intelligent detection and analysis engine 130 may detect and analyze the target DRC rule deck 140 of the integrated circuit layout according to the standard integrated circuit layout 150, to ensure that the implementation of a design rule in the target DRC rule deck 140 of the integrated circuit layout is completely consistent with a definition of a design rule in a DRM of a layout, thereby ensuring subsequent chip functions and a manufacturing yield.

Furthermore, based on the aforementioned embodiments, the check method may further include that the target DRC rule deck 140 of the integrated circuit layout is generated according to a DRM of the integrated circuit layout developed by a semiconductor manufacturing factory.

According to the technical solutions of the embodiments of the disclosure, the intelligent database creation engine 110 may generate the test case database. The intelligent arrangement engine 120 may be controlled to generate the standard integrated circuit layout according to the test case database and provide the target DRC rule deck 140 of the integrated circuit layout for the intelligent detection and analysis engine 130. And the intelligent detection and analysis engine 130 may be controlled to detect and analyze the target DRC rule deck 140 of the integrated circuit layout according to the standard integrated circuit layout 150. Inevitable errors probably caused by manual check in the art can be eliminated, and the check tool for the DRC rule deck of the integrated circuit layout may ensure that the design rule implemented in the DRC rule deck of the integrated circuit layout is consistent with the design rule defined in the DRM of the integrated circuit layout, and further ensure the development quality of the DRC rule deck of the integrated circuit layout. Thus, the check tool for the DRC rule deck of the integrated circuit layout can play a remarkable role in ensuring the stability and quality reliability of the DRC rule deck of the integrated circuit layout and the manufacturing yield of the project can be improved.

It should be noted that the aforementioned description is only the embodiments of the disclosure and the adopted technical principle used in the disclosure. Those skilled in the art should know that the disclosure is not limited to the specific embodiments described herein. Those skilled in the art may make various apparent variations, readjustments, and replacements without departing from the scope of protection of the disclosure. Therefore, although the disclosure is described in relatively more detail with the above embodiments, the disclosure is not limited to the embodiments and may further include more other equivalent embodiments without departing from the concept of the disclosure. The scope of the disclosure is determined by the scope of the appended claims.

The invention claimed is:

1. A check tool for a Design Rule Check (DRC) rule deck of an integrated circuit layout, comprising:
    an intelligent database creation engine, configured to generate a test case database;
    an intelligent arrangement engine, configured to generate a standard integrated circuit layout according to the test case database; and
    an intelligent detection and analysis engine, configured to detect and analyze a target DRC rule deck of the integrated circuit layout according to the standard integrated circuit layout;
    wherein the target DRC rule deck of the integrated circuit layout comprises a plurality of standard specifications of design rules for the integrated circuit layout, and a standard-specification test case database is respectively established for each of the plurality of the standard specifications.

2. The check tool of claim 1, wherein the plurality of the standard specifications comprise a positive specification and a negative specification.

3. The check tool of claim 1, wherein the standard-specification test case database is configured to generate a plurality of standard integrated circuit layouts, and the standard-specification test case database is set in the intelligent database creation engine.

4. The check tool of claim 3, wherein each of the plurality of the standard integrated circuit layouts corresponds to a different golden result.

5. A check tool for a Design Rule Check (DRC) rule deck of an integrated circuit layout, comprising:
    an intelligent database creation engine, configured to generate a test case database;
    an intelligent arrangement engine, configured to generate a standard integrated circuit layout according to the test case database; and
    an intelligent detection and analysis engine, configured to detect and analyze a target DRC rule deck of the integrated circuit layout according to the standard integrated circuit layout;
    wherein the intelligent detection and analysis engine is further configured to generate a detection report, the detection report comprising information for determining whether the target DRC rule deck of the integrated circuit layout is correct;
    in response to the detection report comprising first-type error information of a plurality of standard specifications, the intelligent database creation engine is not updated; and
    in response to the detection report comprising second-type error information of the plurality of the standard specifications, the intelligent database creation engine is updated to yield an updated intelligent database creation engine.

6. The check tool of claim 5, wherein the updated intelligent database creation engine is configured to check the target DRC rule deck of the integrated circuit layout to generate a target detection report, and the target detection report does not comprise the second-type error information.

7. A check method for a Design Rule Check (DRC) rule deck of an integrated circuit layout, applied to a check tool for a DRC rule deck of an integrated circuit layout, and the check method comprising:
    generating a test case database according to an intelligent database creation engine in the check tool;
    controlling an intelligent arrangement engine in the check tool to generate a standard integrated circuit layout according to the test case database; and
    providing a target DRC rule deck of the integrated circuit layout for an intelligent detection and analysis engine in the check tool, and controlling the intelligent detection and analysis engine in the check tool to detect and analyze the target DRC rule deck of the integrated circuit layout according to the standard integrated circuit layout;

wherein the target DRC rule deck of the integrated circuit layout comprises a plurality of standard specifications of design rules for the integrated circuit layout, and a standard-specification test case database is respectively established for each of the plurality of the standard specifications.

8. The check method of claim 7, further comprising:
generating the target DRC rule deck of the integrated circuit layout according to a Design Rule Manual (DRM) of the integrated circuit layout developed by a semiconductor manufacturing factory.

9. The check method of claim 7, wherein the plurality of the standard specifications comprise a positive specification and a negative specification.

10. The check method of claim 7, wherein the method further comprises:
generating a plurality of standard integrated circuit layouts according to the standard-specification test case database;
wherein the standard-specification test case database is set in the intelligent database creation engine in the check tool.

11. The check method of claim 10, wherein each of the plurality of the standard integrated circuit layouts corresponds to a different golden result.

12. The check method of claim 7, further comprising:
generating a detection report, the detection report comprising information for determining whether the target DRC rule deck of the integrated circuit layout is correct.

13. The check method of claim 12, wherein the method further comprises:
in response to the detection report comprising first-type error information of the plurality of the standard specifications, not updating the intelligent database creation engine in the check tool; and
in response to the detection report comprising second-type error information of the plurality of the standard specifications, updating the intelligent database creation engine in the check tool.

14. The check method of claim 13, wherein the method further comprises:
checking the target DRC rule deck of the integrated circuit layout to generate a target detection report, wherein the target detection report does not comprise the second-type error information.

* * * * *